US012347505B2

(12) United States Patent
Li et al.

(10) Patent No.: US 12,347,505 B2
(45) Date of Patent: Jul. 1, 2025

(54) MEMORY DEVICE AND OPERATING METHOD OF THE SAME

(71) Applicant: TAIWAN SEMICONDUCTOR MANUFACTURING COMPANY, LTD., Hsinchu (TW)

(72) Inventors: Gu-Huan Li, Hsinchu County (TW); Tung-Cheng Chang, Miaoli County (TW); Perng-Fei Yuh, Walnut Creek, CA (US); Chia-En Huang, Hsinchu County (TW); Chun-Ying Lee, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/650,058

(22) Filed: Apr. 29, 2024

(65) Prior Publication Data
US 2024/0290408 A1 Aug. 29, 2024

Related U.S. Application Data

(63) Continuation of application No. 18/345,530, filed on Jun. 30, 2023, now Pat. No. 12,002,528, which is a continuation of application No. 17/401,907, filed on Aug. 13, 2021, now Pat. No. 11,735,280.

(51) Int. Cl.
G11C 17/18 (2006.01)
G11C 17/16 (2006.01)
H10B 20/20 (2023.01)

(52) U.S. Cl.
CPC .............. *G11C 17/18* (2013.01); *G11C 17/16* (2013.01); *H10B 20/20* (2023.02)

(58) Field of Classification Search
CPC ..................................... G11C 17/18
USPC ........................................... 365/96
See application file for complete search history.

(56) References Cited

U.S. PATENT DOCUMENTS

| 5,576,994 A * | 11/1996 | Kato ............... G11C 8/08 365/185.26 |
| 6,940,743 B2 * | 9/2005 | Jung ............... G11C 11/4091 365/210.15 |
| 9,524,795 B2 * | 12/2016 | Lee .................... G11C 17/16 |
| 2008/0205118 A1 * | 8/2008 | Gruening-von Schwerin ............. G11C 13/0011 257/E21.409 |
| 2009/0003112 A1 * | 1/2009 | Zumkehr ............ G11C 5/147 365/226 |

(Continued)

*Primary Examiner* — Muna A Techane
(74) *Attorney, Agent, or Firm* — Maschoff Brennan

(57) ABSTRACT

A memory device is provided, including a first bit cell including a first memory cell coupled to a first word line and a second bit cell including a second memory cell coupled to a second word line. The first and second memory cells are coupled to a first control line and further coupled to a first bit line through first and second nodes. The second bit cell further includes a first protection array coupled to the second memory cell at the second node coupled to the first bit line and further coupled to a third word line. When the first and second bit cells operate in different operational types, the first protection array is configured to generate an adjust voltage to the second node according to a voltage level of the third word line while the first bit cell is programmed.

20 Claims, 18 Drawing Sheets

(56) References Cited

U.S. PATENT DOCUMENTS

| | | | |
|---|---|---|---|
| 2011/0068179 A1* | 3/2011 | Lo Giudice | G11C 16/0433 |
| | | | 365/185.23 |
| 2013/0100173 A1* | 4/2013 | Chaji | G09G 3/3275 |
| | | | 345/76 |
| 2020/0219570 A1* | 7/2020 | Ha | G11C 29/24 |

* cited by examiner

# MEMORY DEVICE AND OPERATING METHOD OF THE SAME

CROSS-REFERENCE TO RELATED APPLICATION

The present application is a continuation application of U.S. patent application Ser. No. 18/345,530, filed Jun. 30, 2023, which is a continuation application of U.S. patent application Ser. No. 17/401,907, filed Aug. 13, 2021, now U.S. Pat. No. 11,735,280, issued on Aug. 22, 2023, which are incorporated herein by reference in their entireties.

BACKGROUND

The semiconductor integrated circuit (IC) industry has experienced rapid growth. In some approaches of memory devices, stress induced by unexpected voltage in memory cells during programming is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
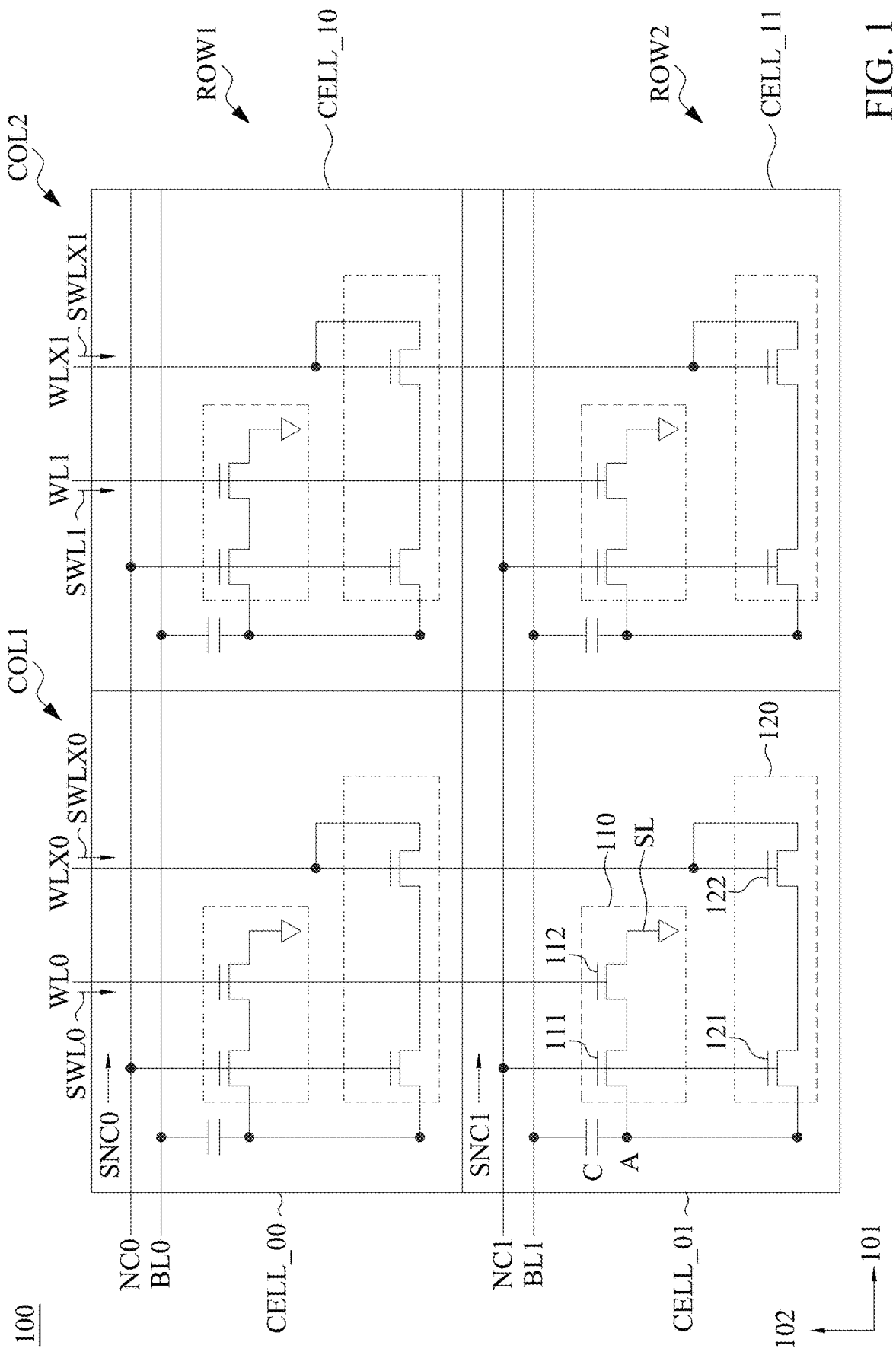
FIG. 1 is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 100, in accordance with some embodiments. For illustration, the memory device 100 includes multiple bit cells CELL_00-CELL11 arranged in rows and columns. Specifically, the bit cells CELL_00 and CELL_10 are arranged in a row ROW1, and the bit cells CELL_01 and CELL_11 are arranged in a row ROW2 abutting the row ROW1 in a direction 102. The bit cells CELL_00 and CELL_01 are arranged in a column COL1, and the bit cells CELL_10 and CELL_11 are arranged in a column COL2 abutting the column COL1 in a direction 101.

In some embodiments, the bit cells CELL_00-CELL_11 have same configurations. For illustration, each of the bit cells CELL_00-CELL11 has at least one memory cell 110 and at least one protection array 120 coupled to the memory cell 110 at a node A. In some embodiments, the bit cells CELL_00-CELL_11 are configured to be programmed to store bit data in the corresponding included memory cells 110. In some embodiments, the memory cells 110 include one time programming (OTP) memory cells. The configurations of the memory cells 110 are given for illustrative purposes. Various implementations of the memory cells 110 are included in the contemplated scope of the present disclosure. For example, in some embodiments, the memory cells 110 includes cells of magnetoresistive random-access memory (MRAM), resistive random-access memory (ReRAM or RRAM), or any other suitable types of memory cells.

As shown in FIG. 1, the memory cell 110 includes transistors 111-112 coupled in series between the node A and a source line SL that couples to a ground terminal. In some embodiments, the source line SL is coupled to a supply voltage terminal to receive a supply voltage VSS. The protection array 120 includes series-coupled transistors 121-122, while the transistor 121 is coupled to the node A. In some embodiments, the transistor 111 includes a fuse transistor and the transistor 112 is referred to as a select transistor. In some embodiments, when the transistor 112 is turned on, the memory cell 110 is selected for reading or programming the data reflected by the state of the transistor 111. In some embodiments, the transistors 111-112 and 121-122 are N-type MOS (metal-oxide-semiconductor) transistors.

For illustration, gate terminals of the transistors 111 and the transistors 121 in the bit cells CELL_00 and CELL_10 are coupled to a control line NC0 to receive a control signal SNC0, and accordingly, the transistors 111 and 121 in the bit cells CELL_00 and CELL_10 are configured to be turned on in response to the control signal SNC0. Similarly, gate terminals of the transistors 111 and the transistors 121 in the bit cells CELL_01 and CELL_11 are coupled to a control line NC1 to receive a control signal SNC1, and accordingly, the transistors 111 and 121 in the bit cells CELL_01 and CELL_11 are configured to be turned on in response to the control signal SNC1.

Drain terminals of the transistors 111 and the transistors 121 in the bit cells CELL_00 and CELL_10 are coupled to the corresponding nodes A (in the bit cells CELL_00 and CELL_10) that couples a bit line BL0 through capacitors C. In some embodiments, the capacitors C are referred to as parasitic capacitors and omitted in the circuit. Similarly, drain terminals of the transistors 111 and the transistors 121 in the bit cells CELL_01 and CELL_11 are coupled to the corresponding nodes A (in the bit cells CELL_01 and CELL_11) that couples a bit line BL1 through capacitors C.

Furthermore, gate terminals of the transistors 112 in the bit cells CELL_00 and CELL_01 are coupled to a word line WL0 to receive a word line signal SWL0, and accordingly, the transistors 112 are configured to be turned on in response to the word line signal SWL0. Similarly, gate terminals of the transistors 112 in the bit cells CELL_10 and CELL_11 are coupled to a word line WL1 to receive a word line signal SWL1, and accordingly, the transistors 112 are configured to be turned on in response to the word line signal SWL1.

As illustratively shown in FIG. 1, the transistors 122 in the bit cells CELL_00-CELL_11 are diode-connected. In the bit cells CELL_00 and CELL_01, gate and source terminals of the transistors 122 are coupled together to a word line WLX0 to receive a word line signal SWLX0. Similarly, in the bit cells CELL_10 and CELL_11, gate and source terminals of the transistors 122 are coupled together to a word line WLX1 to receive a word line signal SWLX1.

In some embodiments, gate terminals of the transistors 122 in each of the bit cells CELL_00, CELL_10, CELL_01, and CELL_11 are coupled to separated word lines and receive different voltages.

The configurations of FIG. 1 are given for illustrative purposes. Various implementations are within the contemplated scope of the present disclosure. For example, in some embodiments, each of the bit cells CELL_00-CELL11 includes more than one memory cells 110 coupled in parallel to store a bit data. In various embodiments, each of the bit cells CELL_00-CELL11 includes more than one protection arrays 120 coupled in parallel. In various embodiments, the memory device 100 includes more than four bit cells that are arranged in different configurations of rows and columns in memory device 100.

In operation, when one of the bit cells CELL_00-CELL11 is selected to be programmed, for example, the bit cell CELL_11, as shown in the table I below:

TABLE I

| | voltage levels of signals | | | |
|---|---|---|---|---|
| | CELL_11 (selected) | CELL_01 (half-selected, type I) | CELL_10 (half-selected, type II) | CELL_00 (un-selected) |
| SNC1 | VNC | VNC | | |
| SNC0 | | | 0 V | 0 V |
| SWL1 | VWL | | VWL | |
| SWL0 | | 0 V | | 0 V |
| SWLX1 | 0 V | | 0 V | |
| SWLX0 | | VWLX | | VWLX |
| VBL1 | VQPS | VQPS | | |

TABLE I-continued

| | voltage levels of signals | | | |
| --- | --- | --- | --- | --- |
| | CELL_11 (selected) | CELL_01 (half-selected, type I) | CELL_10 (half-selected, type II) | CELL_00 (un-selected) |
| VBL0 | | | 0 V | 0 V |
| VSL | 0 V | 0 V | 0 V | 0 V | the word line WL1 is activated (the word signal SWL1 has a voltage VWL), the control signal SNC1 has a voltage VNC (enough to turn on the transistor 111), a voltage level VBL1 of the bit line BL 1 has a voltage VQPS (enough to program the memory cell 110), and the word signal SWLX1 has a voltage level of 0 Volt. The transistors 111-112 of the memory cell 110 in the bit cell CELL_11 are turned on for programming operation, while the transistors 121 and 122 of the protection array 120 in the bit cell CELL_11 are turned on and off respectively.

Furthermore, as the bit cell CELL_11 is selected, the bit cell CELL_01 is referred to as a half-selected bit cell of the type I. The detailed operation is discussed with reference to FIG. 2.

Figure 2:
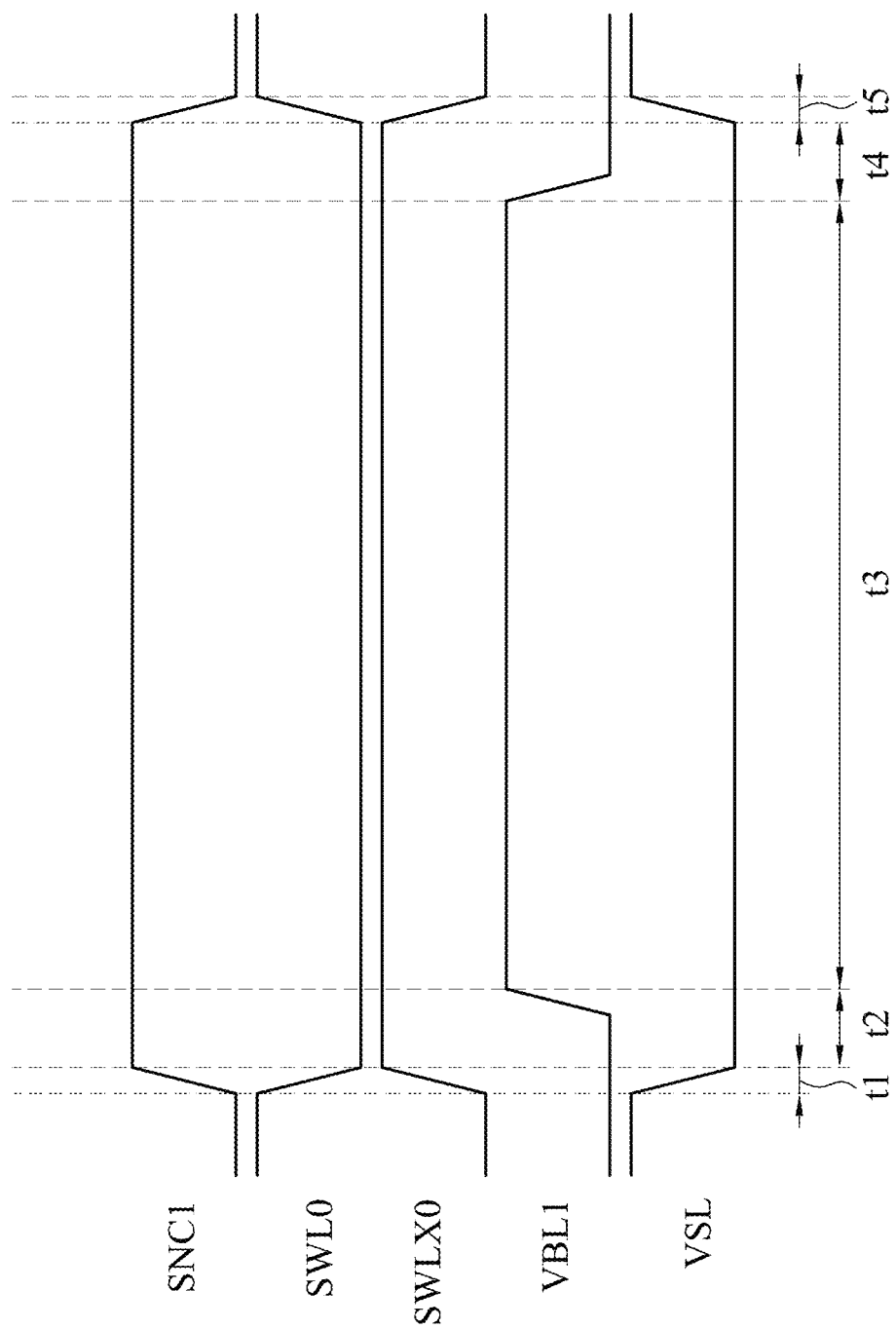
FIG. 2 illustrates schematic waveforms of signals in a corresponding bit cell in the memory device of FIG. 1, in accordance with some embodiments.

As shown in FIG. 2, before programming the bit cell CELL_11, in the time interval t1, a voltage level of the control line signal SNC1 increases from 0 Volt, a voltage level of the word line signal SWL0 decreases from an activate voltage, a voltage level VBL1 of the bit line BL1 remains the same, the source line SL starts discharging, and a voltage level of the word line signal SWLX0 increases.

In the time interval t2, the control line signal SNC1 reaches the voltage VNC, and the transistors 111 and 121 in both of the bit cells CELL_01 and CELL_11 are turned on. The word line signal SWL0 has a 0 Volts to deactivate the memory cell 110 in the bit cell CELL_01 while the word line signal SWL1 has the voltage VWL to activate the memory cell 110 in the bit cell CELL_01. The bit line BL1 starts charging. The source line SL has a 0 Volts. The word line signal SWLX0 has the voltage VWLX at terminals of the diode-connected transistor 122 in the bit cell CELL_01.

In the time interval t3, the memory cell 110 of the bit cell CELL_11 is in a programming mode. The voltage level VBL1 reaches a voltage VQPS and a bit data is written into the memory cell 110 when the transistors 111 and 112 in the bit cell CELL_11 are turned on. In some embodiments, the duration of the time interval t3 is referred to as a program time of the bit cell CELL_11.

In addition, for the half-selected bit cell CELL_01 in the program time of the bit cell CELL_11, the transistors 111 and 121 remain turned-on in response to the control line signal SNC1. The transistor 112 keeps turned-off in response to the word line signal SWL0. The transistor 122 is turned on as the word line signal SWXL0 remains the same. The voltage level of the source line SL does not change in the programming mode. In some embodiments, the voltage level (having the voltage VNC) of the control line signal SNC1 and the voltage level (having the voltage VNC) of the word line signal SWLX0 are greater than the voltage level of the SWL0.

Furthermore, the transistor 122 of the protection array 120 in the bit cell CELL_01 is configured to provide, in response to the word line signal SWLX0, an adjust voltage VA associated with the voltage level of the terminal of the transistor 122 (for example, the voltage level of the word line signal SWLX0 in the embodiments of FIG. 1) to the node A in FIG. 1. Specifically, in FIG. 1, the terminal, that is coupled to the control terminal of the transistor 122 in the bit cell CELL_11, of the transistor 122, has the voltage VWLX, and the transistor 122 has a threshold voltage Vth. Accordingly, when the transistor 121 is turned on in response to the control line signal SNC1, the transistor 122 provides the adjust voltage VA to the node A, in which the adjust voltage VA equals to VWLX-Vth.

In some approaches, bit cells merely have memory cells, and each of the memory cell includes a fuse transistor (for example, the NMOS transistor 111) coupled between a bit line and a select transistor (for example, the NMOS transistor 112) that is coupled to the ground terminal. When a selected bit cell, similar to the bit cell CELL_11, is programmed, fuse transistors in both of the selected bit cell and a half-selected bit cell, similar to the bit cell CELL_01, are turned on. Moreover, although the select transistor in the half-selected bit cell is turned off in response to a word line signal having 0 Volt, a leakage current flowing through the fuse transistor and the selected transistor discharges a node between the bit line and the fuse transistor to have a ground voltage. In such approaches, high voltage stress (caused by a voltage difference between a voltage of the bit line and the node having 0 Volt) is induced in a structure, such like the parasitic capacitor C in FIG. 1, between the node and the bit line, and further causes write disturbance in the memory cell of the half-selected bit cell.

Compared with the approaches mentioned above, with the configurations of the present disclosure, the protection array 120 provides the adjust voltage VA to the node A, and reduces the voltage difference between the bit line BL1 and the node A. Accordingly, the structure between the bit line BL1 and node A experiences less voltage stress, which prevents the memory cell 110 in the half-selected bit cell CELL_01 from the write disturbance when the selected cell bit cell CELL_11 is in the programming mode.

In addition, regarding the half-selected, the type II, bit cell CELL_10 when the bit cell CELL_11 is programmed in the time interval t3, as shown in FIG. 1 and table I, the transistor 112 is turned on in response to the word line signal SWL1 having the voltage VWL. The transistors 111 and 121 are turned off in response to the control line signal SNC0 having 0 Volt. The transistors 122 is off in response to the word line signal SWLX1 having 0 Volt. The voltage levels of the bit line BL0 and the source line SL have 0 Volt.

Moreover, regarding the un-selected bit cell CELL_00 when the bit cell CELL_11 is programmed in the time interval t3, the transistors 111 and 121 are turned off in response to the control line signal SNC0 having 0 Volt. The transistor 112 is off in response to the word line signal SWL0 having 0 Volt. The transistors 122 is on in response to the word line signal SWLX0 having the voltage VWLX. The voltage levels of the bit line BL0 and the source line SL have 0 Volt.

With continued reference to FIG. 2, in the time interval t4, the bit line BL1 starts discharging to have 0 Volt after the bit cell CELL_11 is programmed, while other elements in the memory device 100 have the same configurations as those in the time interval t4.

In the time interval t5, the voltage level of the control line signal SNC1 decreases to 0 Volt, and correspondingly the transistors 111 and 121 in both of the bit cells CELL_01 and CELL_11 are turned off. The voltage level of the word line signal SWL0 increases to have the voltage VWL, and the transistor 112 in the bit cell CELL_01 is turned on. The voltage level VBL1 of the bit line BL1 remains the same, and the source line SL starts charging. The voltage level of the word line signal SWLX0 decreases to 0 Volt to turn off the transistor 122 in the bit cell CELL_01.

The operation configurations of the bit cells in FIGS. 1-2 are given for illustrative purposes. Various implementations are within the contemplated scope of the present disclosure. For example, in some embodiments, the voltages VWLX and VWL are different. In various embodiments, the memory device 100 has more than four bit cells arranged in more than two columns and two rows. One who is skilled in the art can adjust the present disclosure according to the actual practice.

In addition to the embodiments given in FIGS. 1-2, as the bit cells CELL_00-CELL_11 have the same configurations, each of the bit cells CELL_00-CELL_11 are programmable and operates as aforementioned discussion. For example, in some embodiments, when the bit cell CELL_01 is selected, the bit cell CELL_11 is the half-selected bit cell of the type I, the bit cell CELL_00 is the half-selected bit cell of the type II, and the bit cell CELL_10 is un-selected bit cell. In various embodiments, when the bit cell CELL_00 is selected, the bit cell CELL_10 is the half-selected bit cell of the type I, the bit cell CELL_01 is the half-selected bit cell of the type II, and the bit cell CELL_11 is un-selected bit cell. In various embodiments, when the bit cell CELL_10 is selected, the bit cell CELL_00 is the half-selected bit cell of the type I, the bit cell CELL_11 is the half-selected bit cell of the type II, and the bit cell CELL_01 is un-selected bit cell.

Figure 3A:
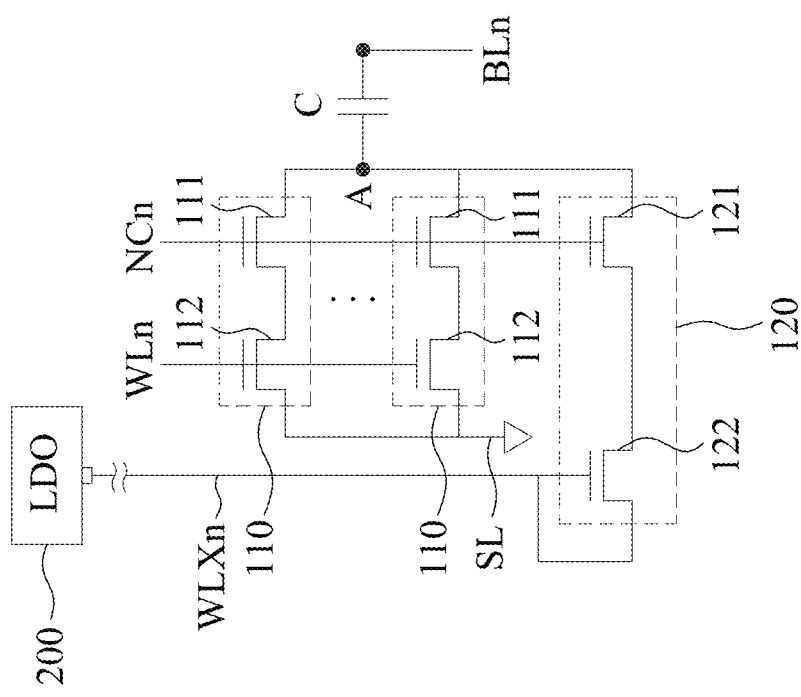
FIG. 3A is a schematic circuit diagram of one of the bit cells in a memory device corresponding to FIG. 1, in accordance with some embodiments.

Reference is now made to FIG. 3A. FIG. 3A is a schematic circuit diagram of one of the bit cells in a memory device corresponding to FIG. 1, in accordance with some embodiments. With respect to the embodiments of FIGS. 1-2, like elements in FIG. 3A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3A. The configurations of the bit cell in FIG. 3A are given for illustration. Each of the bit cells in the memory device 100 in FIG. 1 includes the configurations illustrated in FIG. 3A. Specifically, a word line WLXn is referred to as a corresponding one of the word lines WLX0-WLX1, a word line WLn is referred to as a corresponding one of the word lines WL0-WL1, a control line NCn is referred to as a corresponding one of the control lines NC0-NC1, and a bit line BLn is referred to as a corresponding one of the bit lines BL0-BL1.

In some embodiments, a total of transistors in the protection array 120 configured for protection and a total of transistors in the memory cell 110 for storing data bit in a bit cell are different from each other. As shown in FIG. 3A, compared to FIG. 1, instead of having one memory cell 110 in the bit cell, each of the bit cells CELL_00-CELL_11 has multiple memory cells 110 coupled in parallel between the node A and the source line SL. Taking the bit cell in FIG. 3A as example, it includes seven memory cells 110 and one protection array 120 as shown in FIG. 1. Alternatively stated, a total of fourteen transistors are configured for storing bit data and a total of two transistors are configured for protection in the bit cell.

For illustration, the memory device 100 further includes a voltage generator 200 to provide the voltage VWLX to the protection array 120. In some embodiments, the voltage generator 200 is configured to provide word line signals, for example, word line signal SWLX0, having the voltage VWLX to word lines, for example, the word line WLX0. In some embodiments, the voltage generator includes a low dropout regulator (LDO). In some embodiments, when the voltage VWLX increases, the voltage difference between the bit line and the node decreases. Accordingly, the induced voltage stress reduces in the bit cell.

The configurations of FIG. 3A are given for illustrative purposes. Various implementations are within the contemplated scope of the present disclosure. For example, in some embodiments, the bit cell includes more than 16 transistors and has different ratio of amounts of transistors in the memory cell 110 and the protection array 120. One who is skilled in the art can adjust the configurations of FIG. 3A.

Figure 3B:
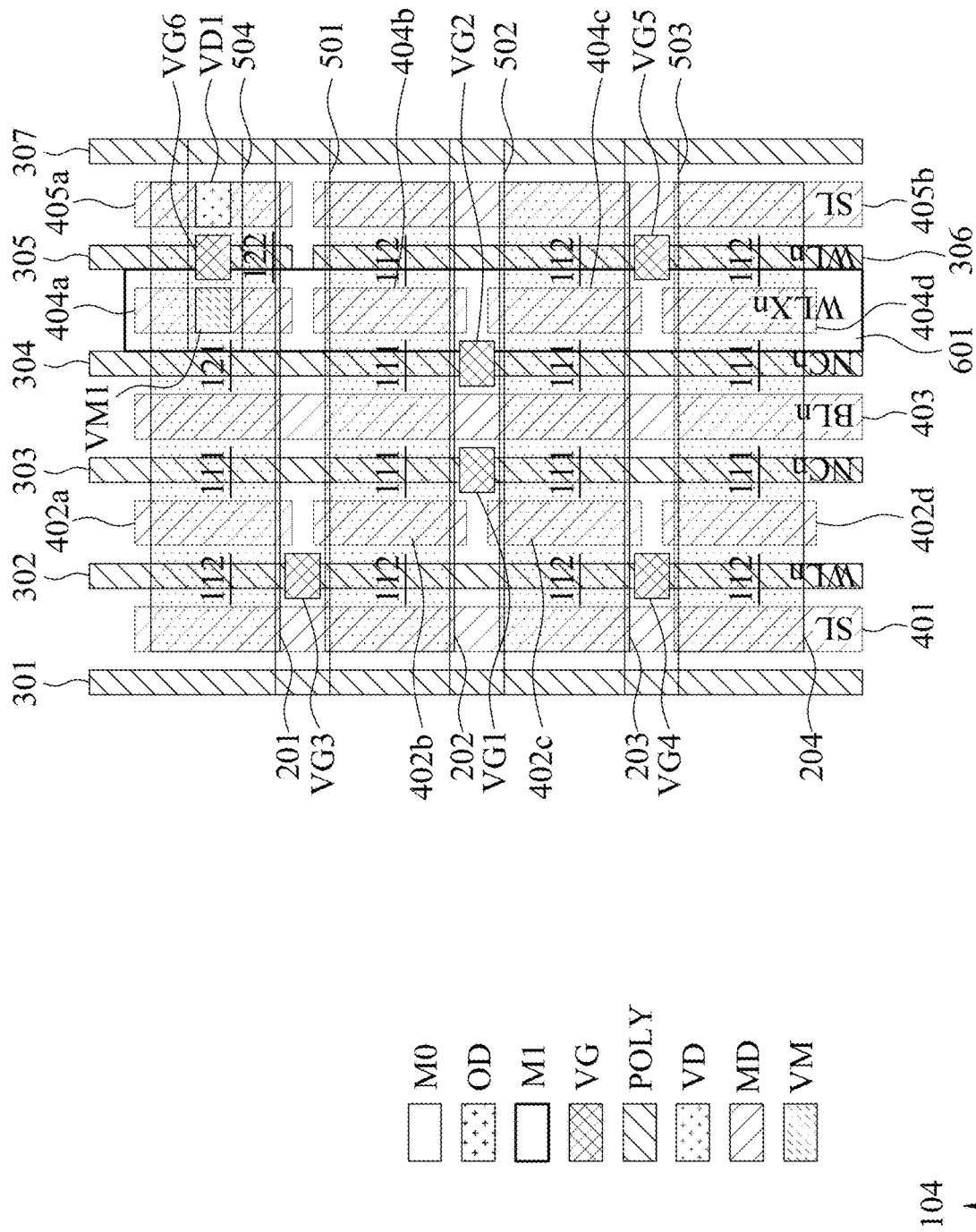
FIG. 3B is layout diagram in a plan view of a section of the bit cell corresponding to FIG. 3A, in accordance with some embodiments.

Reference is now made to FIG. 3B. FIG. 3B is layout diagram in a plan view of a section of the bit cell corresponding to FIG. 3A, in accordance with some embodiments. For illustration, the bit cell includes active areas 201-204, gates 301-307, conductors (for example, metal-on-devices MD) 401, 402a-402d, 403, 404a-404d, 405a-405b, conductive lines (for example, metal-zero layers MD) 501-503, conductive trace (for example, a metal-one layer M1) 601, and vias VG1-VG6, VD1, and VM1. In some embodiments, the active areas 201-204 are doped region on a substrate (not shown.) The conductors 401, 402a-402d, 403, 404a-404d, 405a-405b and the gates 301-307 are disposed in a first layer above the active areas 201-204. The conductive lines 501-503 are disposed in a second layer above the first layer. The conductive trace 601 is disposed in a third layer above the second layer. The via VD1 is disposed above the active area 201. The vias VG1-VG6 are disposed between the first layer and the second layer. The via VM1 is disposed between the second layer and the third layer.

With reference to FIGS. 3A-3B together, the arrangements of the transistors 111-112 and 121-122 corresponding to those in FIG. 3A are shown in FIG. 3B with notations on the gates. In some embodiments, the gates 302 and 306 correspond to gate terminals of the transistors 112, the gates 303-304 correspond to gate terminals of the transistors 111 and 121, and the gate 305 corresponds to a gate terminal of the transistor 122. The gates 301 and 307 are referred to as dummy gates, in which in some embodiments, the "dummy" gate is referred to as being not electrically connected as the gate for MOS devices, having no function in the circuit. The conductor 401 corresponds to the source terminals of four transistors 112. Each of the conductors 402a-402d corresponds to one of drain terminals of the four transistors 112 and one of source terminals of four transistors 111. The conductor 403 corresponds to drain terminals of the transistors 111 and a first terminal of the transistor 121. The conductor 404a corresponds to a second terminal of the transistor 121 and a first terminal of the transistor 122. Each of the conductors 404b-404d corresponds to one of drain terminals of three transistors 112 and one of source terminals of three transistors 111. The conductor 405a corresponds to a second terminal of the transistor 122. The conductor 405b corresponds to the source terminals of three transistors 112.

For illustration, the active areas 201-204 extend in a direction 103 and are separated from each other in the direction 104.

The gates 301-307 extend in the direction 104 and are separated from each other in the direction 103. The gates 305 and 306 are separated from each other in the direction 104.

The conductors 401, 402a-402d, 403, 404a-404d, 405a-405b extend in the direction 104 and are disposed between the gates 301-307. The conductors 402a-402d are separated from each other in the direction 104. The conductors 404a-404d are separated from each other in the direction 104. The conductors 405a-405b are separated from each other in the direction 104. The conductors 401 and 405*b* are configured to receive a signal from the source line SL for the bit cell. In some embodiments, the signal is the supply voltage VSS or a ground voltage. The conductor 403 is configured to receive a signal from a bit line BL.

The conductive lines 501-503 extend in the direction 103 are separated from each other in the direction 104. The vias VG1 and VG2 couple the conductive line 502 to the gates 303-304 respectively to transmit one of the control line signals SNC0-SNC1 on one of the control lines NC0-NC1 to the bit cell. The via VG3 couples the conductive line 501 to the gate 302 to transmit one of the word line signals SWL0-SWL1 on one of the word lines WL0-WL1 to the gate 302. Similarly, the vias VG4 and VG5 couple the conductive line 503 to the gates 302 and 306 respectively to transmit the one of the word line signals SWL0-SWL1 on the one of the word lines WL0-WL1 to the gates 302 and 306.

The conductive trace 601 extends in the direction 104 and overlaps the conductive lines 501-504. The conductive trace 601 is coupled to the gate 305 through the via VM1 coupled to the conductive line 504 and the via VG6 coupled between the gate 305 and the conductive line 504. The conductive line 504 couples the gate 305 to the conductor 405*a* through the vias VG6 and VD1. Accordingly, the conductive trace 601 is configured to transmit one of the word line signals SWLX0-SWLX1 on one of the word lines WLX0-WLX1 to the gate 305 and the conductor 405*a* that correspond to the control terminal and a terminal of the transistor 122.

The configurations of FIGS. 3A-3B are given for illustrative purposes. Various implementations are within the contemplated scope of the present disclosure. For example, in some embodiments, the transistor 122 is formed in any suitable position in the layout of FIG. 3B.

Figure 4A:
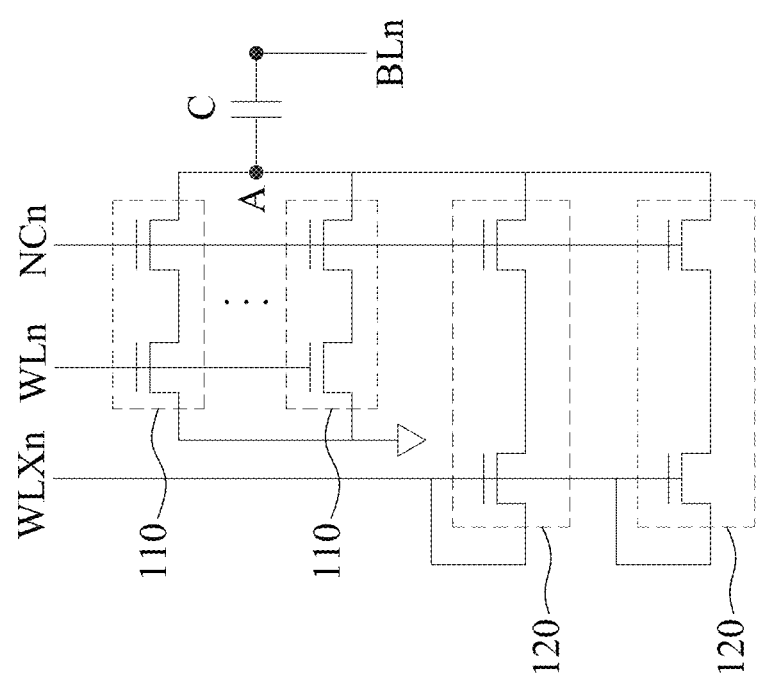
FIG. 4A is a schematic circuit diagram of one of the bit cells in a memory device corresponding to FIG. 1, in accordance with some embodiments.

Reference is now made to FIG. 4A. FIG. 4A is a schematic circuit diagram of one of the bit cells in a memory device corresponding to FIG. 1, in accordance with some embodiments. With respect to the embodiments of FIGS. 1-3B, like elements in FIG. 4A are designated with the same reference numbers for ease of understanding.

Compared with FIG. 3A, instead of having only one protection array 120, the bit cell in FIG. 4A includes two protection arrays 120 and reduced number of the memory cells 110, namely six memory cells 110.

Figure 4B:
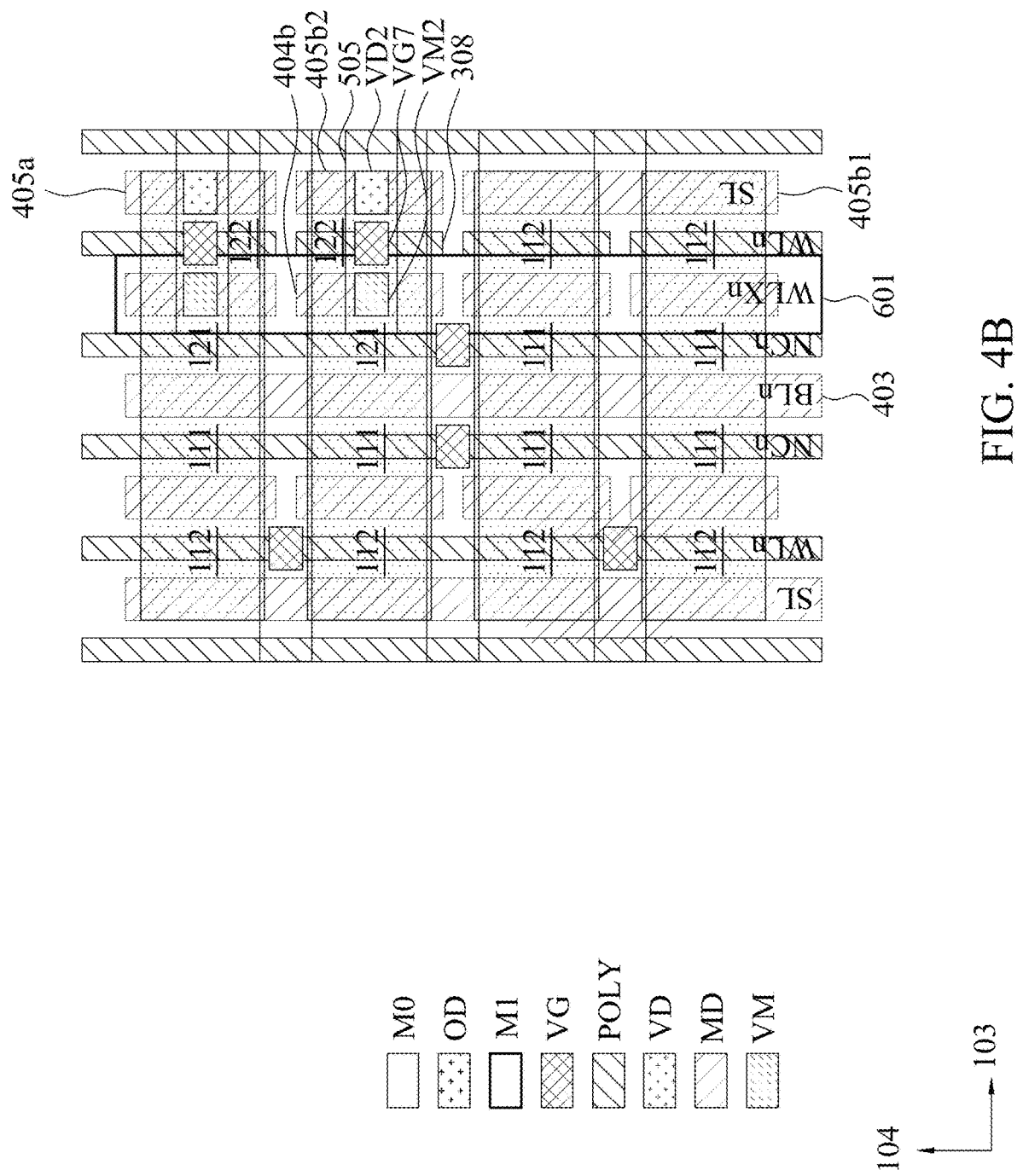
FIG. 4B is layout diagram in a plan view of a section of the bit cell corresponding to FIG. 4A, in accordance with some embodiments.

Reference is now made to FIG. 4B. FIG. 4B is layout diagram in a plan view of a section of the bit cell corresponding to FIG. 4A, in accordance with some embodiments.

For illustration, instead of having the conductor 405*b* in FIG. 3B, the bit cell in FIG. 4B further includes conductors 405*b*1-405*b*2, a gate 308, a conductive line 505, and vias VD2, VG7, and VM2. In some embodiments, the conductors 405*b*1-405*b*2 are configured with respect to, for example, the conductor 405*a*. The gate 308 is configured with respect to, for example, the gate 305. The conductive line 505 is configured with respect to, for example, the conductive line 504. The vias VD2, VG7, and VM2 are configured with respect to, for example, the vias VD1, VG6, and VM1 separately.

In some embodiments, the conductor 403 further corresponds to first terminals of two transistors 121 in the protection arrays 120. The conductor 404*b* corresponds to a second terminal of one of the transistors 121 and a first terminal of one of the transistors 122. The conductor 405*b*2 corresponds to a second terminal of the one transistor 122, while the conductor 405*b*1 corresponds to the source terminals of the transistors 112.

For illustration, the via VM2 couples the conductive trace 601 to the conductive line 505. The vias VG7 and VD2 further couple the conductive line 505 to the gate 308 and the conductor 405*b*2 respectively. Accordingly, the conductive trace 601 is further configured to transmit one of the word line signals SWLX0-SWLX1 on one of the word lines WLX0-WLX1 to the gate 308 and the conductor 405*b*2 that correspond to a control terminal and a terminal of the transistor 122.

The configurations of FIGS. 4A-4B are given for illustrative purposes. Various implementations are within the contemplated scope of the present disclosure. For example, in some embodiments, the layout in FIG. 4B further includes metal routing for connection between elements in FIG. 4A.

Figure 5A:
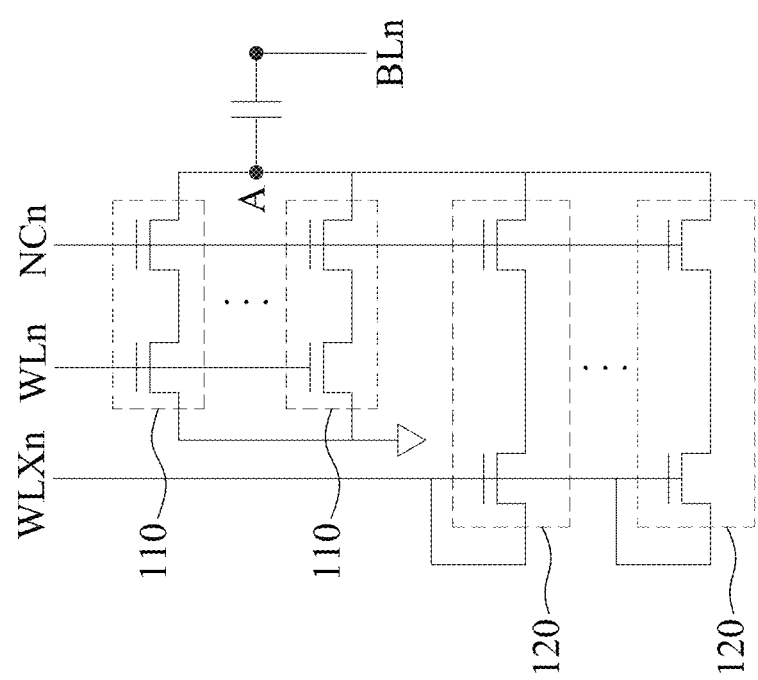
FIG. 5A is a schematic circuit diagram of one of the bit cells in a memory device corresponding to FIG. 1, in accordance with some embodiments.

Reference is now made to FIG. 5A. FIG. 5A is a schematic circuit diagram of one of the bit cells in a memory device corresponding to FIG. 1, in accordance with some embodiments. With respect to the embodiments of FIGS. 1-4B, like elements in FIG. 5A are designated with the same reference numbers for ease of understanding.

Compared with FIGS. 3A and 4A, instead of having different numbers of the memory cells 110 and the protection arrays 120, the bit cell in FIG. 5A includes equal numbers of the memory cells 110 and the protection arrays 120. Accordingly, a total of transistors in the memory cells 110 is equal to a total of transistors in the protection arrays 120. Specifically, the bit cell in FIG. 5A includes four memory cell 110 and four protection arrays 120.

Figure 5B:
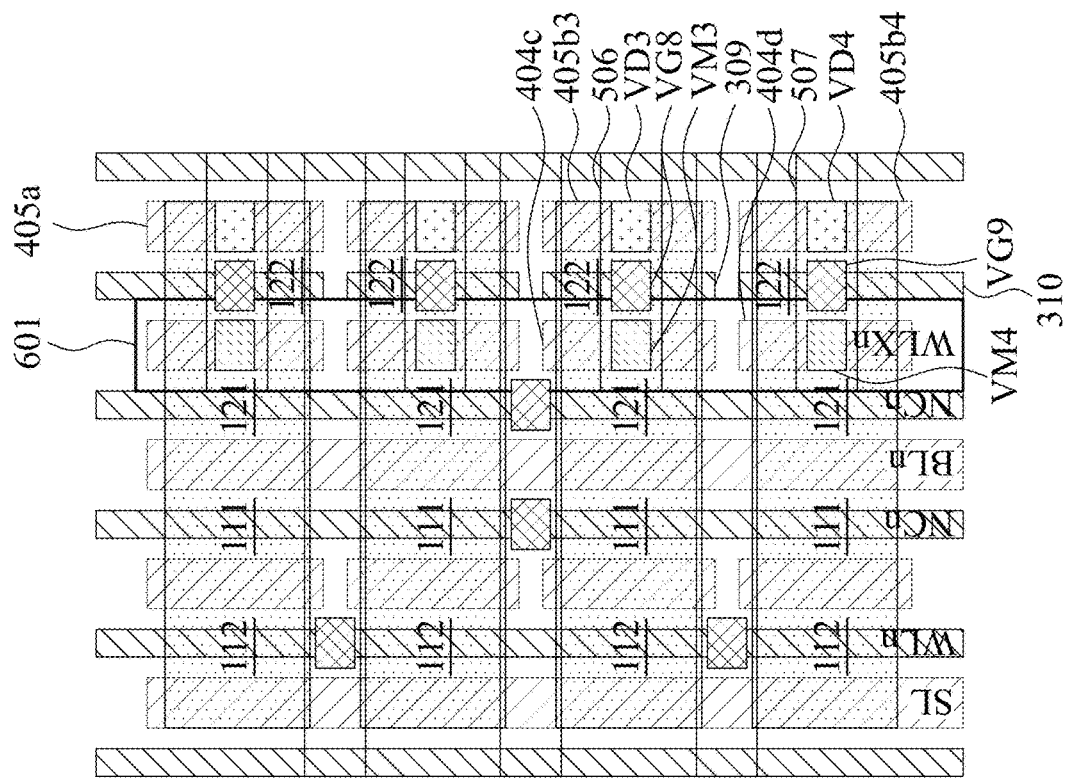
FIG. 5B is layout diagram in a plan view of a section of the bit cell corresponding to FIG. 5A, in accordance with some embodiments.
Figure 5B:
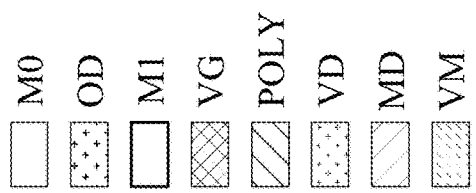
Figure 5B:
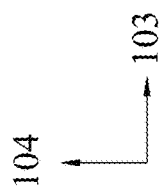

Reference is now made to FIG. 5B. FIG. 5B is layout diagram in a plan view of a section of the bit cell corresponding to FIG. 5A, in accordance with some embodiments.

For illustration, instead of having the conductor 405*b*1 in FIG. 4B, the bit cell in FIG. 4B further includes conductors 405*b*3-405*b*4, gates 309-310, conductive lines 506-507, and vias VD3-4, VG8-VG9, and VM3-VM4. In some embodiments, the conductors 405*b*3-405*b*4 are configured with respect to, for example, the conductor 405*b*2. The gates 309-310 are configured with respect to, for example, the gate 308. The conductive lines 506-507 are configured with respect to, for example, the conductive line 505. The vias VD3-4, VG8-VG9, and VM3-VM4 are configured with respect to, for example, the vias VD1, VG6, and VM1 separately.

In some embodiments, the conductor 403 further corresponds to first terminals of all transistors 121 in the protection arrays 120. The conductors 404*c*-404*d* correspond to second terminals of the transistors 121 and first terminals of the transistors 122. The conductors 405*b*3-405*b*4 correspond to second terminals of the transistors 122.

For illustration, the vias VM3-VM4 couple the conductive trace 601 to the conductive lines 506-507 respectively. The vias VG8 and VD3 further couple the conductive line 506 to the gate 309 and the conductor 405*b*3 respectively. The vias VG9 and VD4 further couple the conductive line 507 to the gate 310 and the conductor 405*b*4 respectively. Accordingly, the conductive trace 601 is further configured to transmit one of the word line signals SWLX0-SWLX1 on one of the word lines WLX0-WLX1 to the gates 309-310 and the conductors 405*b*3-405*b*4 that correspond to control terminals and terminals of the transistors 122.

The configurations of FIGS. 5A-5B are given for illustrative purposes. Various implementations are within the contemplated scope of the present disclosure. For example, in some embodiments, the bit cell includes more than four memory cells 110 and more than four protection arrays 120.

Figure 6A:
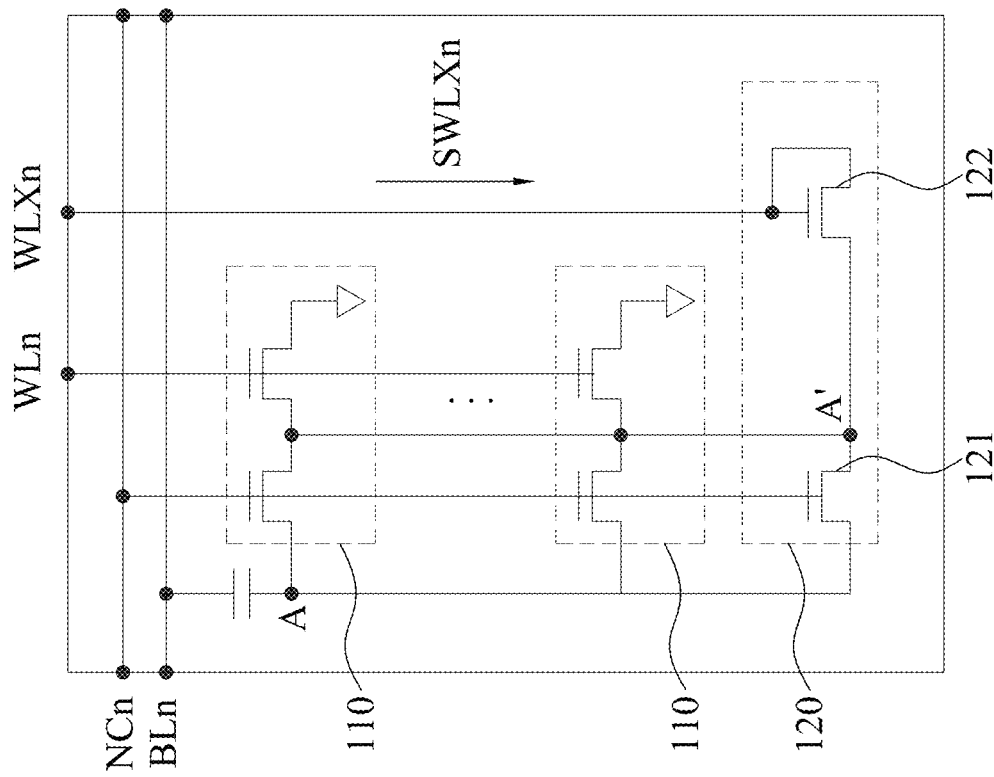
FIG. 6A is a schematic circuit diagram of one of the bit cells in a memory device corresponding to FIG. 1, in accordance with some embodiments.

Reference is now made to FIG. 6A. FIG. 6A is a schematic circuit diagram of one of the bit cells in a memory device corresponding to FIG. 1, in accordance with some embodiments. With respect to the embodiments of FIGS. 1-5B, like elements in FIG. 6A are designated with the same reference numbers for ease of understanding.

Compared with FIG. 3A, the transistor 122 in the protection array 120 is further coupled to terminals of the transistors 112 in the memory cells at a node A'. In operation of the bit cell of half-selected type I, when the transistor 121 is turned on in response to the control line signal SNCn, a voltage level of the node A' is equal to that of the node A. Alternatively stated, the transistor 122 in the protection array 120 provide the adjust voltage VA to the node A and node A', in which the adjust voltage equals to the difference between the voltage level of the word line signal SWLXn and the threshold voltage of the transistor 122.

Figure 6B:
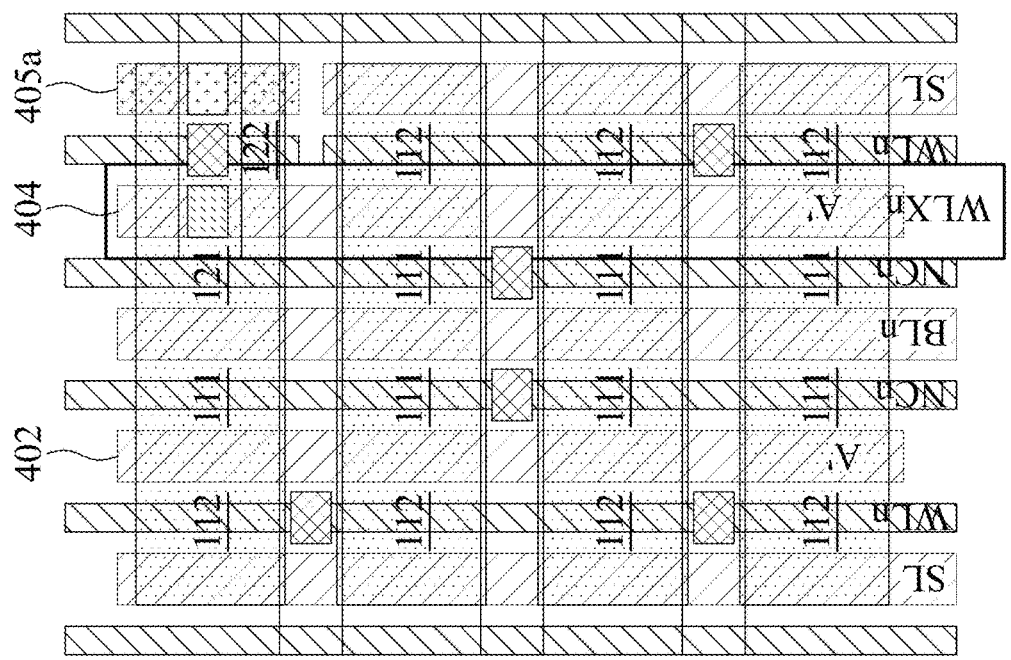
FIG. 6B is layout diagram in a plan view of a section of the bit cell corresponding to FIG. 6A, in accordance with some embodiments.
Figure 6B:
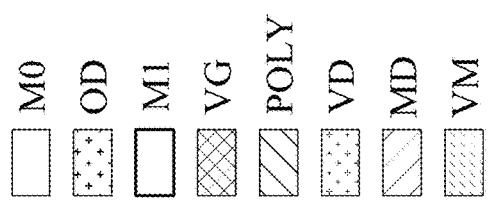
Figure 6B:
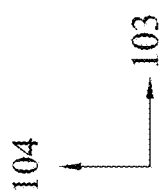

Reference is now made to FIG. 6B. FIG. 6B is layout diagram in a plan view of a section of the bit cell corresponding to FIG. 6A, in accordance with some embodiments.

Compared with FIG. 3B, instead of having the separated conductors 402a-404d and 404a-404d, the bit cell in FIG. 6B includes conductor 402 and 404 that extend in the direction 104. In some embodiments, the conductor 402 corresponds the drain terminals of the four transistors 112 and the source terminals of four transistors 111 that are coupled together at the node A'. Similarly, the conductor 404 corresponds the drain terminals of the three transistors 112, the source terminals of three transistors 111, and a terminal of the transistor 122 that are coupled together at the node A'.

The configurations of FIGS. 6A-6B are given for illustrative purposes. Various implementations are within the contemplated scope of the present disclosure. For example, in some embodiments, the layout in FIG. 6B further includes metal routing for connection between elements in FIG. 6A.

Figure 7A:
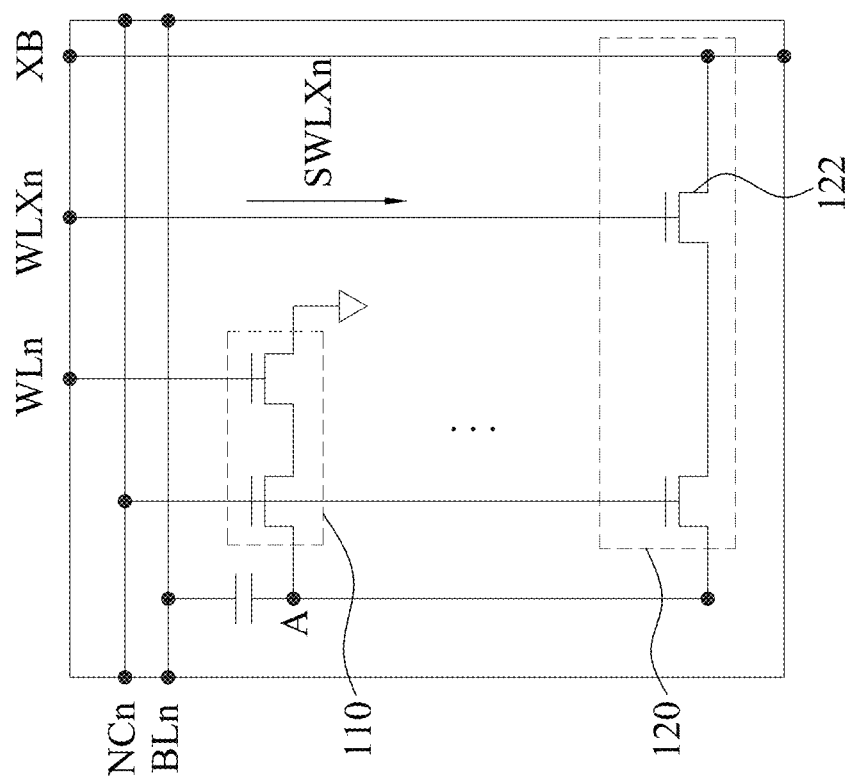
FIG. 7A is a schematic circuit diagram of one of the bit cells in a memory device corresponding to FIG. 1, in accordance with some embodiments.

Reference is now made to FIG. 7A. FIG. 7A is a schematic circuit diagram of one of the bit cells in a memory device corresponding to FIG. 1, in accordance with some embodiments. With respect to the embodiments of FIGS. 1-6B, like elements in FIG. 7A are designated with the same reference numbers for ease of understanding.

Compared with FIG. 3B, instead of the transistor 122 in the protection array 120 being diode-connected, the control terminal of the transistor 122 in FIG. 7A is coupled to the word line WLXn and a terminal of the transistor 122 is coupled to a conductive line XB to receive a bias voltage. In operation of the bit cell of the half-selected, type I, when the voltage level of the word line signal SWLXn is greater than the bias voltage, the transistor 122 is configured to provide the bias voltage to the node A. Alternatively stated, the adjust voltage equals to bias voltage in the programming mode.

Figure 7B:
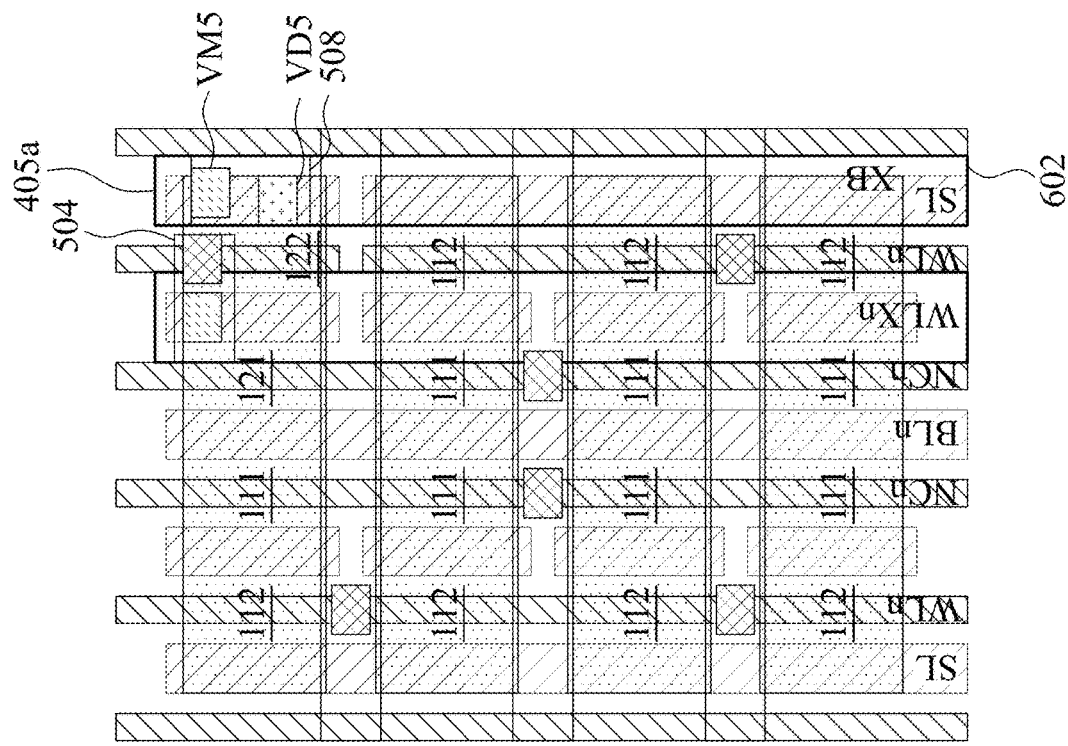
FIG. 7B is layout diagram in a plan view of a section of the bit cell corresponding to FIG. 7A, in accordance with some embodiments.
Figure 7B:
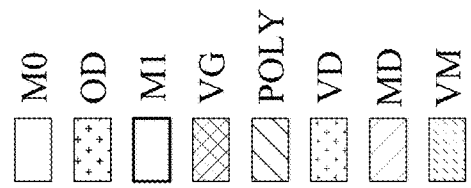
Figure 7B:
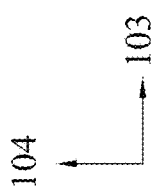

Reference is now made to FIG. 7B. FIG. 7B is layout diagram in a plan view of a section of the bit cell corresponding to FIG. 7A, in accordance with some embodiments.

Compared with FIG. 3B, instead of having the conductor 405a coupled to the conductive line 504, the bit cell in FIG. 7B further includes a conductive line 508, a conductive trace 602, and vias VD5 and VM5. In some embodiments, the conductive line 508 is configured with respect to, for example, the conductive line 504. The conductive trace 602 is configured with respect to, for example, the conductive trace 601. The vias VD5 and VM5 are configured with respect to, for example, the vias VD4 and VM4.

The conductive line 508 and the conductive trace 602 extend in the direction 104. The via VM5 couples the conductive trace 602 to the conductive line 508. The via VD5 couples the conductive line 508 to the conductor 405a. Accordingly, the conductive trace 602 is configured to transmit the bias voltage on the conductive line XB to the conductor 405a.

The configurations of FIGS. 7A-7B are given for illustrative purposes. Various implementations are within the contemplated scope of the present disclosure. For example, in some embodiments, more than one protection arrays 120 are coupled between the node A and the conductive line XB.

Figure 8A:
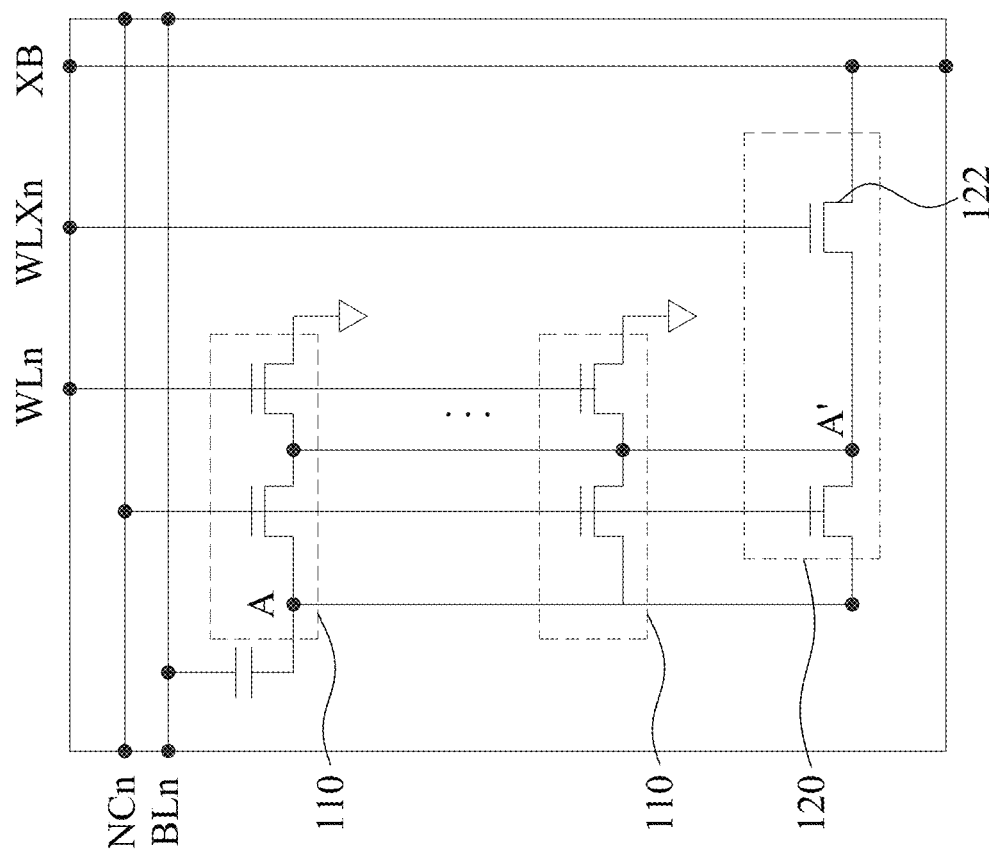
FIG. 8A is a schematic circuit diagram of one of the bit cells in a memory device corresponding to FIG. 1, in accordance with some embodiments.

Reference is now made to FIG. 8A. FIG. 8A is a schematic circuit diagram of one of the bit cells in a memory device corresponding to FIG. 1, in accordance with some embodiments. With respect to the embodiments of FIGS. 1-7B, like elements in FIG. 8A are designated with the same reference numbers for ease of understanding.

Compared with FIG. 6A, the transistor 122 in the protection array 120 of the bit cell in FIG. 8A is coupled between the transistor 121 and the conductive line XB. Based on the embodiments mentioned above, in operation of the bit cell of half-selected type I, the transistor 122 provides the adjust voltage VA to the node A and node A', in which the adjust voltage equals to the bias voltage when the voltage level of the word line signal SWLXn is greater than the bias voltage.

Figure 8B:
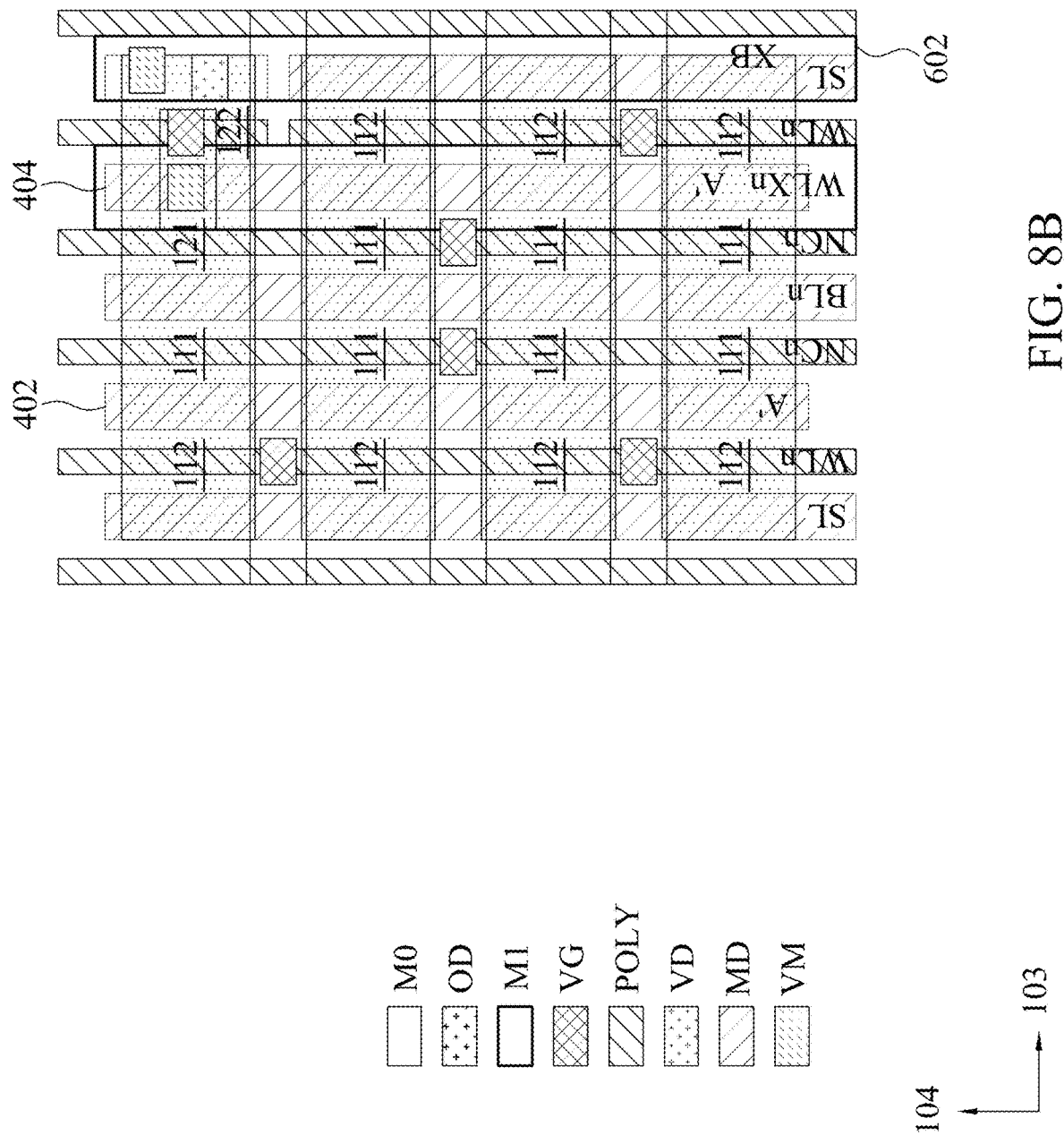
FIG. 8B is layout diagram in a plan view of a section of the bit cell corresponding to FIG. 8A, in accordance with some embodiments.

Reference is now made to FIG. 8B. FIG. 8B is layout diagram in a plan view of a section of the bit cell corresponding to FIG. 8A, in accordance with some embodiments.

Compared with FIG. 6B, the structures corresponding to the transistor 122 in FIG. 8B have the configurations of the structures corresponding to the transistor 122 in FIG. 7B.

The configurations of FIGS. 8A-8B are given for illustrative purposes. Various implementations are within the contemplated scope of the present disclosure. For example, in some embodiments, the bit cell have same amount of the memory cells 110 and the protection arrays 120.

Figure 9:
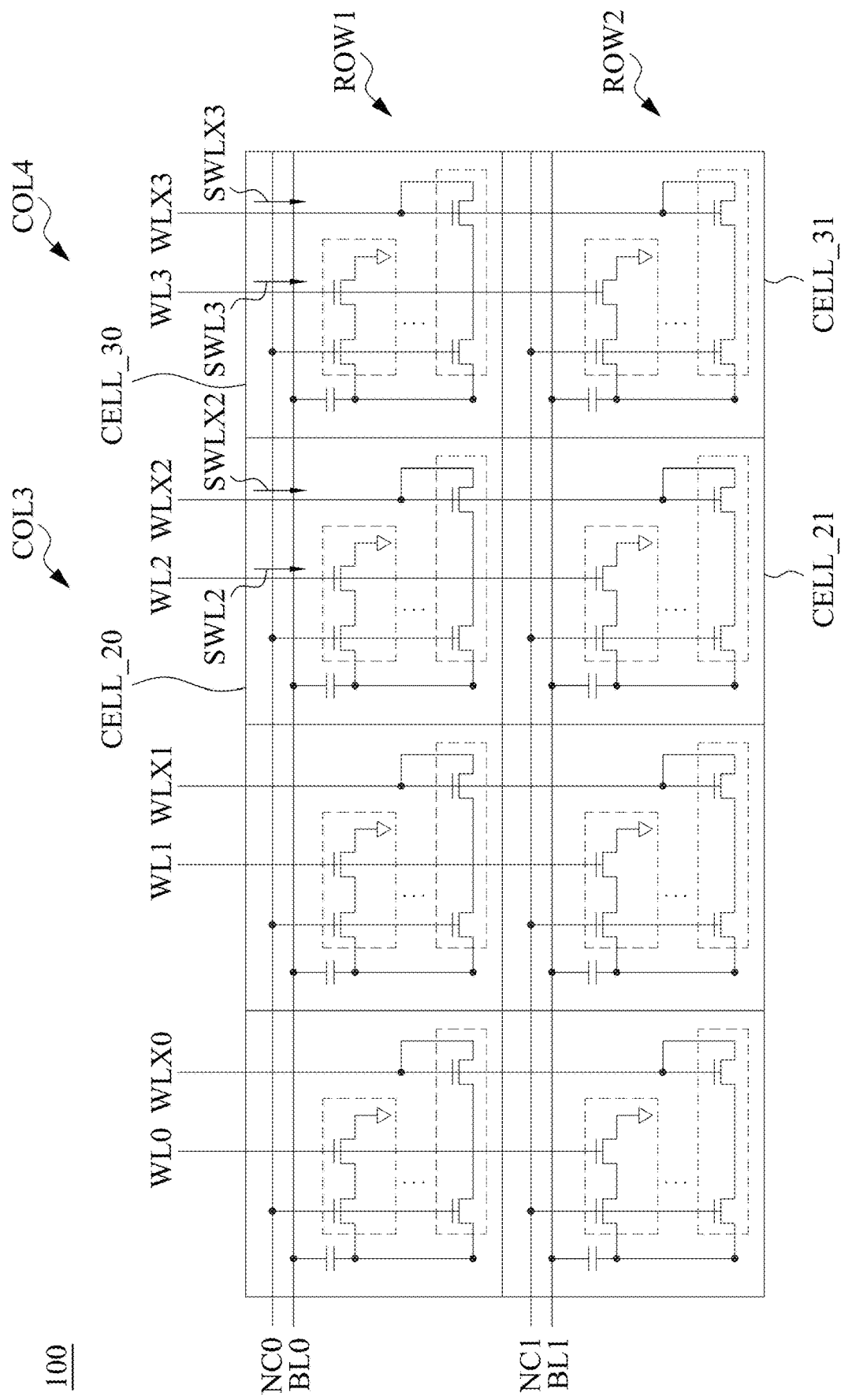
FIG. 9 is a schematic diagram of the memory device corresponding to FIG. 1, in accordance with some embodiments.

Reference is now made to FIG. 9. FIG. 9 is a schematic diagram of the memory device 100 corresponding to FIG. 1, in accordance with some embodiments. With respect to the embodiments of FIGS. 1-8B, like elements in FIG. 9 are designated with the same reference numbers for ease of understanding.

Compared with FIG. 1, the memory device 100 further includes bit cells CELL_20, CELL_21, CELL_30, and CELL_31. For illustration, the bit cells CELL_20 and CELL_30 are arranged in the row ROW1, and the bit cells CELL_21 and CELL_31 are arranged in the row ROW2. The bit cells CELL_20 and CELL_21 are arranged in a column COL3, and the bit cells CELL_30 and CELL_31 are arranged in a column COL4. The columns COL3-COL4 abut the column COL2. In some embodiments, the bit cells CELL_20, CELL_21, CELL_30, and CELL_31 are configured with respect to, for example, each of the bit cells in FIG. 1.

Specifically, the bit cells CELL_20 and CELL_30 are coupled to the control line NC0 and the bit line BL0. The bit cells CELL_21 and CELL_31 are coupled to the control line NC1 and the bit line BL1. In addition, the bit cells CELL_20 and CELL_21 are coupled to word lines WL2 and WLX2 to be selected. The bit cells CELL_30 and CELL_31 are coupled to word lines WL3 and WLX3 to be selected. The configurations of the bit cells CELL_20, CELL_21, CELL_30, and CELL_31 are similar to the bit cells in FIG. 1. Hence, the repetitious descriptions are omitted here.

Figure 10:
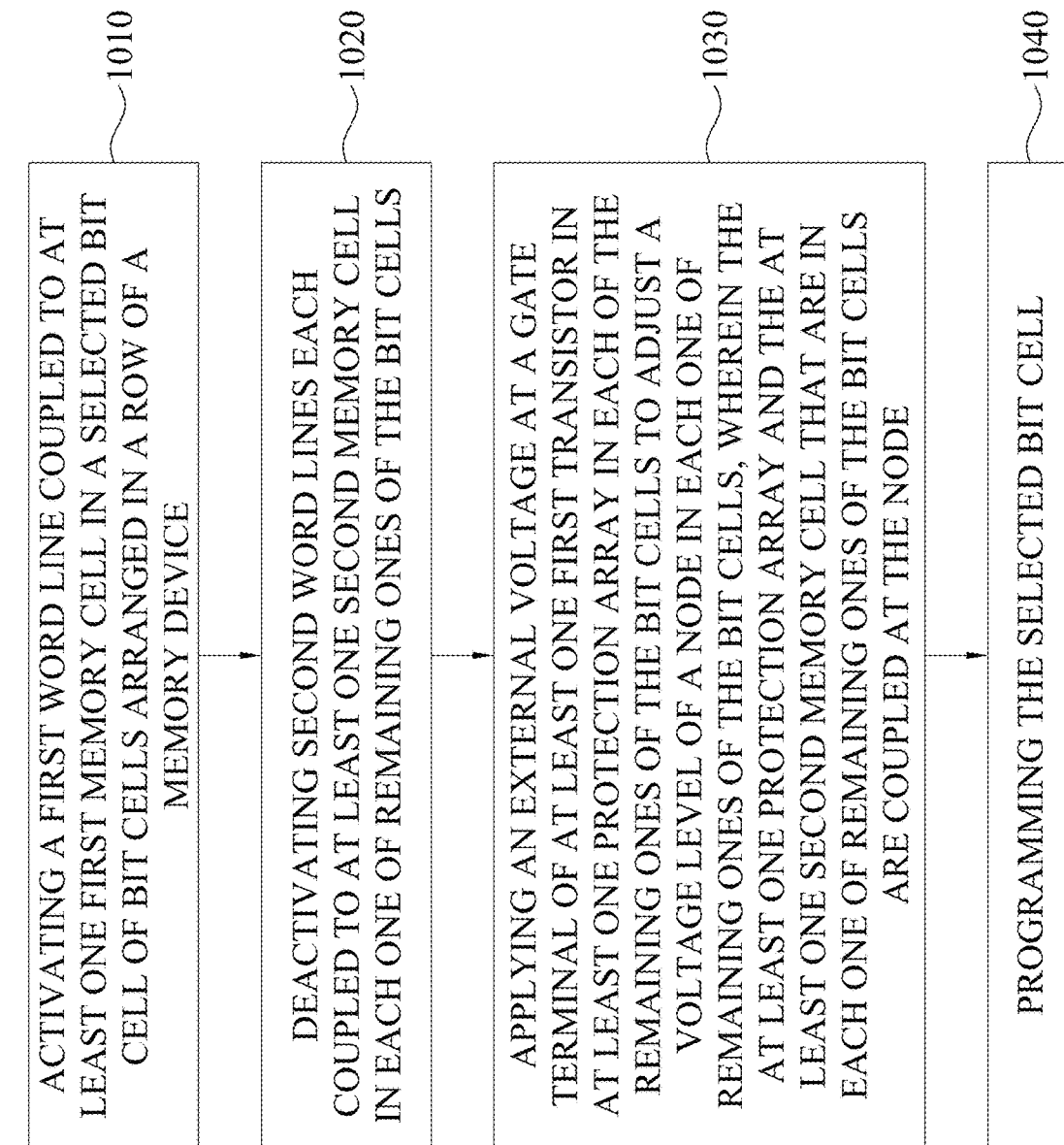
FIG. 10 is a flow chart of an operating method of a memory device, in accordance with some embodiments.

Reference is now made to FIG. 10. FIG. 10 is a flow chart of an operating method 1000 of the memory device 100, in accordance with some embodiments. It is understood that additional operations can be provided before, during, and after the processes shown by FIG. 10, and some of the operations described below can be replaced or eliminated, for additional embodiments of the method. The order of the operations/processes may be interchangeable. Throughout the various views and illustrative embodiments, like reference numbers are used to designate like elements. The operating method 1000 includes operations 1010-1040 that are described below with reference to the memory device in FIGS. 1-9.

In operation 1010, as shown in FIG. 9, the word line WL1 coupled to the memory cell 110 in the bit cell CELL_11 of the bit cells CELL_01, CELL_11, CELL_21, and CELL_31 arranged in the row ROW2 of the memory device 100 is activated, while the bit cell CELL_11 is selected for programming.

In operation 1020, the word lines WL0, WL2, and WL3 that are coupled to the memory cells in the remaining ones (e.g., CELL_01, CELL_21, and CELL_31) of the bit cells in the row ROW2 are deactivated.

In operation 1030, the external voltage (e.g., the voltage VWLX in table I, or word line signals SWLX0, SWLX2, and SWLX3) is applied at the gate terminal of the transistors 122 in the protection arrays 120 in each of the bit cells CELL_01, CELL_21, and CELL_31 to adjust the voltage level of the node A in each one of the bit cells CELL_01, CELL_21, and CELL_31. The protection arrays 120 and the memory cells 110 in each one of the bit cells CELL_01, CELL_21, and CELL_31 are coupled at the node A thereof.

In operation 1040, the selected bit cell CELL_11 is programmed.

In some embodiments, the operating method 1000 further includes turning on, in response to the control signal NC1, the transistors 121 coupled between the transistors 122 and the node A in each one of the bit cells CELL_01, CELL_21, and CELL_31. When the transistors 122 is diode-connected (i.e., the control terminal is coupled to one of terminal thereof), the voltage level of the node A is the voltage difference between the external voltage and the threshold voltage of the transistor 122, as shown in FIGS. 1 and 9.

In some embodiments, the operating method 1000 further includes applying the bias voltage at the terminal of the transistor 122 in each of the bit cells CELL_01, CELL_21, and CELL_31, and applying the control voltage (e.g., the voltage VNC in table I) at the gate terminal of the transistor 121 in each of the bit cells CELL_01, CELL_21, and CELL_31 to transmit the bias voltage to the node A, as shown in FIGS. 7A and 8A.

In some embodiments, as shown in FIG. 2, a voltage level of the gate terminal of the transistor 122 in the protection array 120 in each of the bit cells CELL_01, CELL_21, and CELL_31 increases in the time interval t1 to reach the external voltage (e.g. the voltage of the signal SWLX0). The operating method 1000 further includes charging the bit line BL1 coupled to the bit cells CELL_01, CELL_11, CELL_21, and CELL_31 in the time interval t2 after the time interval t1.

Furthermore, in some embodiments, with continued reference to FIG. 2, after programming the selected bit cell CELL_11, the operating method 1000 further includes discharging in the time interval t4 the bit line BL1 coupled to the bit cells CELL_01, CELL_11, CELL_21, and CELL_31 and decreasing voltage levels at the gate terminal of the transistor 122 in the protection array 120 in each of the CELL_01, CELL_21, and CELL_31 in the time interval t5 after the time interval t4.

Figure 11:
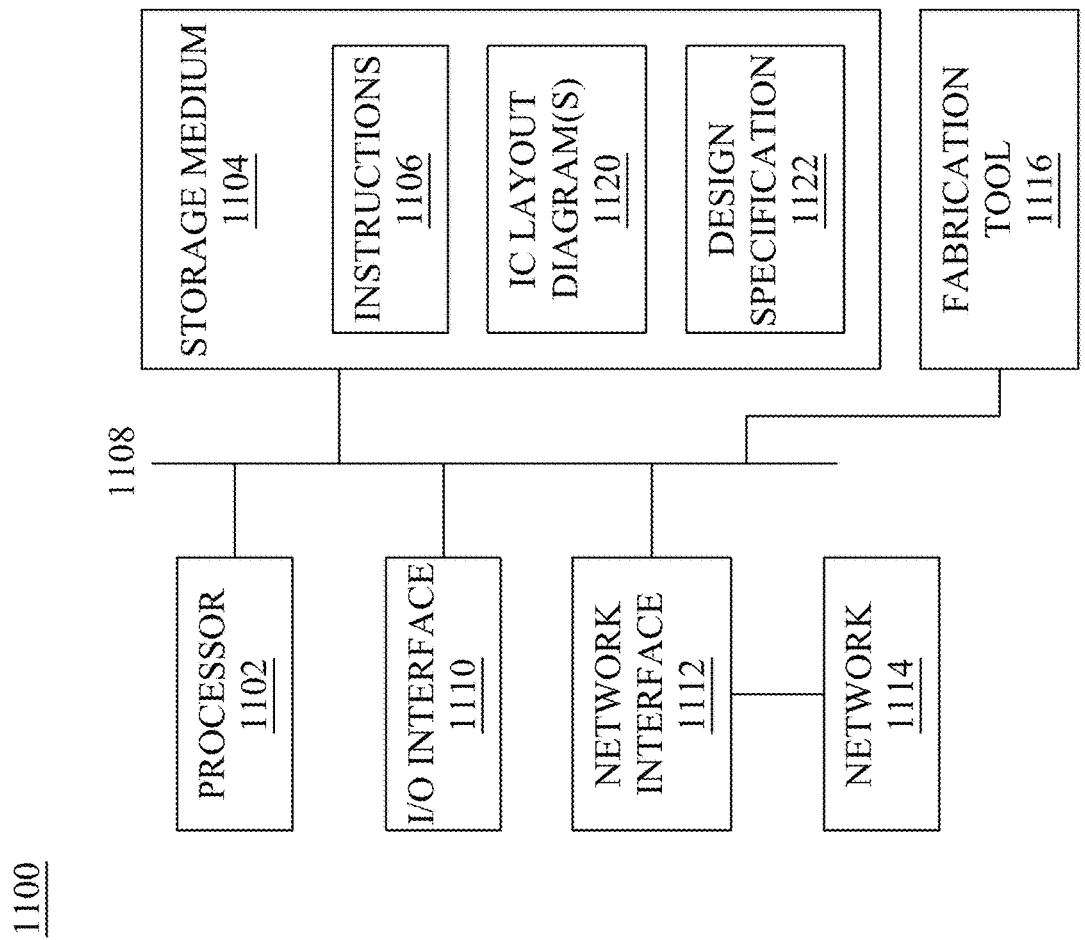
FIG. 11 is a block diagram of a system for designing the integrated circuit layout design, in accordance with some embodiments of the present disclosure.

Reference is now made to FIG. 11. FIG. 11 is a block diagram of an electronic design automation (EDA) system 1100 for designing the integrated circuit layout design, in accordance with some embodiments of the present disclosure. EDA system 1100 is configured to implement one or more operations of the operating method 1000 disclosed in FIG. 10, and further explained in conjunction with FIGS. 1-9. In some embodiments, EDA system 1100 includes an APR system.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code (instructions) 1106, i.e., a set of executable instructions. Execution of instructions 1106 by hardware processor 1102 represents (at least in part) an EDA tool which implements a portion or all of, e.g., the operating method 1000.

The processor 1102 is electrically coupled to computer-readable storage medium 1104 via a bus 1108. The processor 1102 is also electrically coupled to an I/O interface 1110 and a fabrication tool 1116 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. The processor 1102 is configured to execute computer program code 1106 encoded in computer-readable storage medium 1104 in order to cause EDA system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause EDA system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores IC layout diagram 1120 of standard cells including such standard cells as disclosed herein, for example, a cell including in the bit cells discussed above with respect to FIGS. 1-9.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows EDA system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1164. In one or more embodiments, a portion or all of noted processes and/or methods, is implemented in two or more systems 1100.

EDA system 1100 also includes the fabrication tool 1116 coupled to processor 1102. The fabrication tool 1116 is configured to fabricate integrated circuits, e.g., the memory device in FIGS. 1-9, according to the design files processed by the processor 1102.

EDA system 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as design specification 1122.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 12:
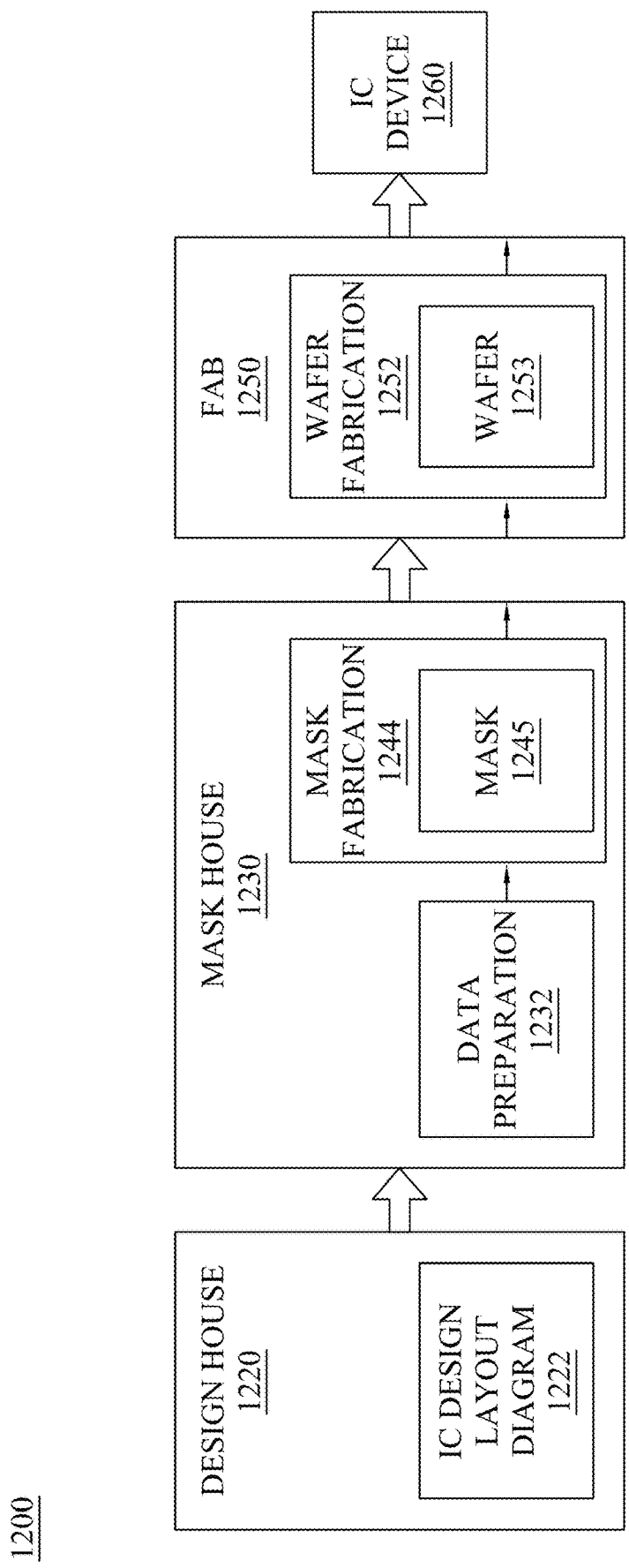
FIG. 12 is a block diagram of an integrated circuit manufacturing system, and an integrated circuit manufacturing flow associated therewith, in accordance with some embodiments.

FIG. 12 is a block diagram of IC manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in IC manufacturing system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns, for example, an IC layout design depicted in FIGS. 1-9, designed for an IC device 1260, for example, the memory device 100 discussed above with respect to FIGS. 1-9. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The IC design layout diagram 1222 is manipulated by mask data preparation 1232 to comply with particular characteristics of the mask writer and/or requirements of IC fab 1250. In FIG. 12, data preparation 1232 and mask fabrication 1244 are illustrated as separate elements. In some embodiments, data preparation 1232 and mask fabrication 1244 can be collectively referred to as mask data preparation.

In some embodiments, data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1245 includes a transparent substrate (for example, fused quartz) and an opaque material (for example, chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 includes wafer fabrication 1252. IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

As described above, the present disclosure provides a memory device including at least one protection array coupled to memory cells in bit cells. The at least one protection array provides an adjust voltage at a node coupled between the memory cells and a bit line, and accordingly, prevents the memory cells from write disturbance. The reliability of the memory device is correspondingly improved.

Accordingly to some embodiments, a memory device is provided and includes a first memory cell coupled to a first word line and a second bit cell including a second memory cell coupled to a second word line. The first and second memory cells are coupled to a first control line and further coupled to a first bit line through first and second nodes. The second bit cell further includes a first protection array coupled to the second memory cell at the second node coupled to the first bit line and further coupled to a third word line. When the first and second bit cells operate in different operational types, the first protection array is configured to generate an adjust voltage to the second node according to a voltage level of the third word line while the first bit cell is programmed.

In some embodiments, a voltage level of the first word line and the voltage level of the third word line are different.

In some embodiments, the first bit cell further includes a second protection array coupled to the first memory cell at the first node and further coupled to a fourth word line. A voltage level of the fourth word line and the voltage level of the third word line are different.

In some embodiments, the second protection array is configured to generate the adjust voltage to the first node according to the voltage level of the fourth word line while the second bit cell is programmed.

In some embodiments, the first protection array includes a first transistor having a first terminal coupled to the first control line and a second terminal coupled to the second node; and a second transistor having a first terminal coupled to a third terminal of the first transistor and second to third terminals coupled together to the third word line.

In some embodiments, the memory device further includes a third bit cell including a third memory cell coupled to the second word line; and a second protection array coupled to the third word line. The third memory cell and the second protection array are coupled to a second control line and further coupled to a second bit line through a third node.

In some embodiments, when the first bit cell is programmed, a voltage level of the second control line is smaller than that of the first control line.

In some embodiments, when the first bit cell is programmed, a voltage level of the second bit line is smaller than that of the first bit line.

In some embodiments, the memory device further includes a third bit cell including a third memory cell coupled to the second word line; and a second protection array coupled to the third word line. The third memory cell and the second protection array are coupled to a second control line and further coupled to a second bit line through a third node. The memory device further includes a fourth bit cell including a fourth memory cell coupled to the first word line; and a third protection array coupled to a fourth word line. The fourth memory cell and the third protection array are coupled to the second control line and further coupled to the second bit line through a fourth node.

In some embodiments, the first bit cell further includes a fourth protection array coupled to the fourth word line and the first control line. The fourth protection array is further coupled to the first bit line through the first node.

In some embodiments, when the first bit cell is programmed, the voltage level of the third word line is greater than a voltage level of the fourth word line.

Accordingly to some embodiments, a method is provided and includes steps of operating a first bit cell in a first operational type and operating a second bit cell in a second operational type different from the first operational type. Operating the first bit cell in the first operational type includes transmitting a first voltage and a second voltage to a first control line and a first word line respectively and transmitting a third voltage to a second word line to a first protection array coupled to a first memory cell of the first bit cell at a first node, wherein the first control line and the first word line are coupled to the first memory cell. Operating the second bit cell includes transmitting the first voltage and the third voltage to the second bit cell through the first control line and a third word line coupled to the second bit cell and transmitting a fourth voltage through a second protection array of the second bit cell to a second node. The fourth voltage is greater than the second voltage.

In some embodiments, the method further includes transmitting a fifth voltage to a bit line after transmitting the first to fourth voltages to the first and second bit cells. The bit line is coupled to the first and second bit cells through the first and second nodes.

In some embodiments, the method further includes operating a third bit cell in a third operational type different from the first and second operational types by transmitting a ground voltage to a second control line coupled to a second memory cell and a third protection array that are in the third bit cell. The third protection array is coupled to the first protection array through the second word line.

In some embodiments, the first protection array includes series of first transistors coupled between the first node and the second word line, and the second protection array includes series of second transistors coupled between the second node and a fourth word line transmitting the fourth voltage.

According to some embodiments, a memory device is provided and includes a first bit cell including a first memory cell coupled to a first word line and a second bit cell including a second memory cell coupled to a second word line. The first and second memory cells are coupled to a first control line and further coupled to a first bit line through first and second nodes. The first bit cell further includes a first protection array that is coupled to the first memory cell at the first node and a third word line having a first voltage level in a programming mode of the first bit cell. The second bit cell further includes a second protection array that is coupled to the second memory cell at the second node and a fourth word line having a second voltage level different from the first voltage level in the programming mode of the first bit cell. The second protection array is configured to couple the fourth word line to the second node in response to the second voltage level on the fourth word line and a first control signal in the first control line.

In some embodiments, the second voltage level of the fourth word line is greater than the first voltage level of the fourth word line.

In some embodiments, in the programming mode of the first bit cell, the second node has a voltage level equal to the second voltage level of the fourth word line minus a threshold voltage of a transistor in the second protection array.

In some embodiments, the transistor is diode-connected to the fourth word line.

In some embodiments, the memory device includes a third bit cell coupled to the first and third word lines and a fourth bit cell coupled to the second and fourth word lines. A first transistor in the third bit cell is configured to be turned off to disconnect the third word line from a third memory cell in the third bit cell in response to a control signal, and a second transistor in the fourth bit cell is configured to be turned off to disconnect the fourth word line from a fourth memory cell in the fourth bit cell in response to the control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first memory cell and a second memory cell coupled to a first control line and a first bit line, wherein the first memory cell is further coupled to a first word line, and the second memory cell is further coupled to a second word line;
a plurality of first transistors coupled in series between a third word line and the first bit line; and
a plurality of second transistors coupled in series between a fourth word line and the first bit line.

2. The memory device of claim 1, wherein the first memory cell comprises:

a third transistor having a gate terminal coupled to the first control line; and a fourth transistor having a gate terminal coupled to the first word line.

3. The memory device of claim 1, wherein a first transistor in the plurality of first transistors has a gate terminal coupled to the first control line, and a second transistor in the plurality of first transistors has a gate terminal and a source/drain terminal that are coupled to the third word line.

4. The memory device of claim 2, wherein a first transistor in the plurality of first transistors has a gate terminal coupled to the first control line, a source/drain terminal coupled to a source/drain terminal of a second transistor in the plurality of first transistors, and a drain/source terminal coupled to a source/drain terminal of the third transistor, wherein the second transistor in the plurality of first transistors has a gate terminal and a drain/source terminal that are coupled to the third word line.

5. The memory device of claim 1, wherein a first transistor in the plurality of second transistors has a gate terminal coupled to the first control line, a source/drain terminal coupled to a source/drain terminal of a second transistor in the plurality of second transistors, and a drain/source terminal coupled to the second memory cell, wherein the second transistor in the plurality of second transistors has a gate terminal and a drain/source terminal that are coupled to the fourth word line.

6. The memory device of claim 2, further comprising:
a capacitor coupled between the first bit line and a source/drain terminal of the third transistor.

7. The memory device of claim 2, further comprising:
a third memory cell, comprising:
a fifth transistor having a gate terminal coupled to the first word line; and
a sixth transistor having a gate terminal coupled to a second control line; and
a plurality of seventh transistors coupled to the second control line and the third word line.

8. The memory device of claim 7, wherein a first transistor in the plurality of seventh transistors has a gate terminal coupled to the second control line, and a second transistor in the plurality of seventh transistors has a gate terminal and a source/drain terminal that are coupled to the third word line.

9. The memory device of claim 7, further comprising:
a fourth memory cell, comprising:
an eighth transistor having a gate terminal coupled to the second word line; and
a protection circuit coupled to the fourth memory cell and comprising a ninth transistor having a gate terminal and a source/drain terminal that are coupled to the fourth word line.

10. The memory device of claim 1, wherein the plurality of first transistors and the plurality of second transistors are of N type transistors.

11. A method, comprising:
transmitting a first voltage to a first control line and a first bit line that are coupled to a first memory cell, a second memory cell, a first protection transistor, and a second protection transistor, wherein the first protection transistor is coupled to the first memory cell, the second memory cell, and the second protection transistor through the first control line;

transmitting the first voltage to a first word line coupled to the first memory cell and to a second word line coupled to a third protection transistor, wherein the third protection transistor is coupled to the second protection transistor;

transmitting a second voltage to a third word line coupled to the second memory cell; and transmitting a third voltage to a fourth word line coupled to a fourth protection transistor, wherein the fourth protection transistor is coupled to the first protection transistor, wherein the second voltage and the third voltage are greater than the first voltage.

12. The method of claim 11, wherein the first voltage is a ground voltage.

13. The method of claim 11, further comprising:
transmitting a fourth voltage to a second control line that is coupled to a third memory cell, a fourth memory cell, a fifth protection transistor, and a sixth protection transistor, wherein the fifth protection transistor is coupled to the third memory cell, the fourth memory cell, and the sixth protection transistor through the second control line.

14. The method of claim 13, further comprising:
transmitting a fifth voltage to a second bit line coupled to the third memory cell and the fourth memory cell, wherein the fifth voltage is greater than the first voltage.

15. The method of claim 13, wherein the first word line is further coupled to the third memory cell.

16. A memory device, comprising:
a first transistor of a first memory cell and a first transistor of a second memory cell, a first protection transistor, and a second protection transistor that have gate terminals coupled to each other through a first control line;

a second transistor of the first memory cell having a gate terminal coupled to a first word line;

a second transistor of the second memory cell having a gate terminal coupled to a second word line;

a third protection transistor that is coupled to the first protection transistor and has a gate terminal coupled to a third word line and; and a fourth protection transistor that is coupled to the second protection transistor and has a gate terminal coupled to a fourth word line.

17. The memory device of claim 16, wherein a voltage of the fourth word line is smaller than that of the third word line.

18. The memory device of claim 16, wherein a voltage of the second word line is greater than that of the first word line.

19. The memory device of claim 16, wherein a source/drain terminal of the first transistor of the first memory cell is coupled to a source/drain terminal of the first protection transistor and a bit line.

20. The memory device of claim 16, wherein a source/drain terminal of the first transistor of the second memory cell is coupled to a source/drain terminal of the second protection transistor and a bit line.

* * * * *